US011888074B2

(12) United States Patent
Lin et al.

(10) Patent No.: US 11,888,074 B2
(45) Date of Patent: Jan. 30, 2024

(54) FLASH MEMORY DEVICE WITH THREE-DIMENSIONAL HALF FLASH STRUCTURE AND METHODS FOR FORMING THE SAME

(71) Applicant: Taiwan Semiconductor Manufacturing Company Limited, Hsinchu (TW)

(72) Inventors: Yu-Chu Lin, Tainan (TW); Chi-Chung Jen, Kaohsiung (TW); Yi-Ling Liu, Hsinchu (TW); Wen-Chih Chiang, Hsinchu (TW); Keng-Ying Liao, Tainan (TW); Huai-Jen Tung, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/868,192

(22) Filed: Jul. 19, 2022

(65) Prior Publication Data
US 2022/0359760 A1 Nov. 10, 2022

Related U.S. Application Data

(62) Division of application No. 17/191,334, filed on Mar. 3, 2021, now Pat. No. 11,658,248.

(51) Int. Cl.
*H01L 29/788* (2006.01)
*H01L 21/265* (2006.01)
(Continued)

(52) U.S. Cl.
CPC .... *H01L 29/7883* (2013.01); *H01L 21/26513* (2013.01); *H01L 29/40114* (2019.08); *H01L 29/41725* (2013.01); *H01L 29/42324* (2013.01); *H01L 29/66492* (2013.01); *H01L 29/66825* (2013.01); *H01L 29/7833* (2013.01); *H10B 41/30* (2023.02)

(58) Field of Classification Search
None
See application file for complete search history.

(56) References Cited

U.S. PATENT DOCUMENTS

| 2009/0215243 A1* | 8/2009 | Ogura | H10B 41/30 257/E21.546 |
| 2019/0097060 A1* | 3/2019 | Leobandung | H01L 29/7885 |
| 2020/0013888 A1* | 1/2020 | Su | H01L 29/0653 |

FOREIGN PATENT DOCUMENTS

TW 201605018 A 2/2016

OTHER PUBLICATIONS

Taiwanese Patent and Trademark Office, Application No. 110130876, Office Action, dated Oct. 4, 2022, 6 pages.

* cited by examiner

*Primary Examiner* — Xiaoming Liu
(74) *Attorney, Agent, or Firm* — The Marbury Law Group, PLLC

(57) ABSTRACT

A flash memory device and method of making the same are disclosed. The flash memory device is located on a substrate and includes a floating gate electrode, a tunnel dielectric layer located between the substrate and the floating gate electrode, a smaller length control gate electrode and a control gate dielectric layer located between the floating gate electrode and the smaller length control gate electrode. The length of a major axis of the smaller length control gate electrode is less than a length of a major axis of the floating gate electrode.

20 Claims, 14 Drawing Sheets

(51) Int. Cl.
*H01L 21/28* (2006.01)
*H01L 29/423* (2006.01)
*H01L 29/417* (2006.01)
*H01L 29/66* (2006.01)
*H01L 29/78* (2006.01)
*H10B 41/30* (2023.01)

FLASH MEMORY DEVICE WITH THREE-DIMENSIONAL HALF FLASH STRUCTURE AND METHODS FOR FORMING THE SAME

RELATED APPLICATIONS

This application is a divisional application of U.S. application Ser. No. 17/191,334 entitled "Flash Memory Device with Three Dimensional Half Flash Structure and Methods for Forming the Same," filed on Mar. 3, 2021, the entire contents of which are incorporated herein by reference for all purposes.

BACKGROUND

To program flash memory, a voltage may be applied to the control gate resulting in charge accumulation in the floating gate. The charge accumulation in the floating gate may result in induced various capacitances For example, induced capacitances may form between the control gate and the floating gate ($C_{ONO}$), between the drain and the floating gate ($C_D$), between the source and the floating gate ($C_S$) and between the floating gate and the bulk semiconductor as measured in the channel ($C_B$). The coupling ratio of a flash memory cell may be defined as the ratio of the capacitance between the control gate and the floating gate $C_{ONO}$ to the sum of the capacitances ($C_{ONO}+C_D+C_S+C_B$). Flash memory cells with a higher coupling ratio may achieve faster programming times than flash memory cells with a lower coupling ratio.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
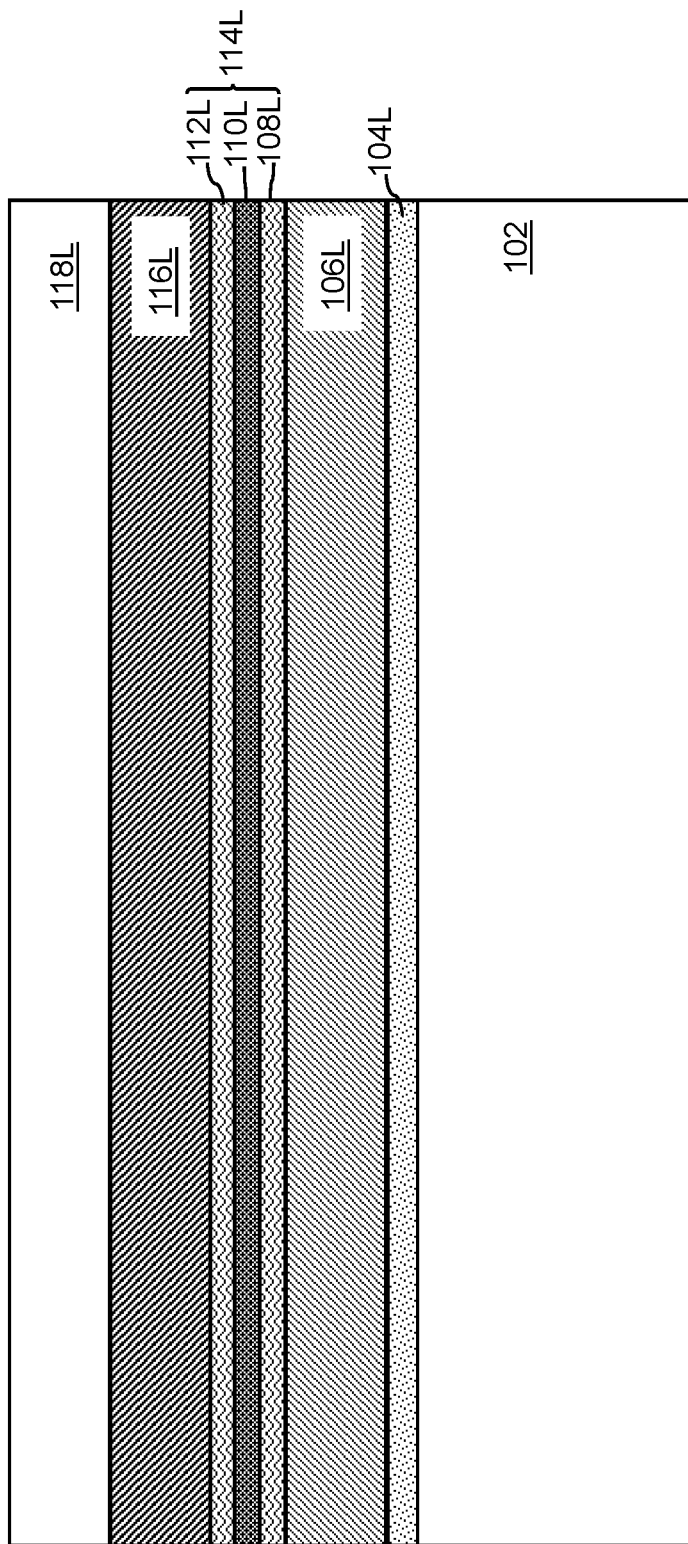
FIG. 1 is a vertical cross-sectional view illustrating a step of forming a continuous tunnel dielectric layer, a continuous floating gate layer, a continuous control gate dielectric layer, a continuous control gate layer and photoresist layer on a substrate in a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure can be used to form flash memory devices in which at least some of the flash memory devices have a control gate electrode that is shorter in length than the length of the corresponding floating gate electrode. Further, at least some of the flash memory devices have at least one electrical contact to the gate dielectric layer in addition to the electrical contacts to the source region, drain region and control gate electrode. The floating gate electrode can be programmed and erased by applying a voltage to the electrical contact connected to the gate dielectric layer. By using the electrical contact to the gate dielectric layer for programming and erasing rather than using the control gate electrode, the resistance $R_{poly}$ associated with the polysilicon control gate electrode can be avoided. The elimination of the resistance $R_{poly}$ associated with the polysilicon control gate electrode may result in a better coupling ratio which results in faster programming and erasing of the flash memory device.

In some embodiments, more than one electrical contact may be provided to the gate dielectric layer. The use of more than one electrical contact to the gate dielectric layer may result in an increased coupling area. The increased coupling area may in turn result in a higher coupling ratio. The coupling ratio is defined by equation 1 below:

$$\alpha_{cg} = \frac{C_{ONO}}{(C_D + C_S + C_B + C_{ONO})} \qquad \text{Equation 1}$$

Where $\alpha_{cg}$ is the coupling ratio, $C_{ONO}$ is the capacitance between the control gate and the floating gate, $C_D$ is the capacitance between the drain and the floating gate, $C_S$ is the capacitance between the source and the floating gate, and $C_B$ is the capacitance between the floating gate and the bulk semiconductor as measured in the channel. As discussed above, the increase in the coupling ratio may result in faster programming and erasing of the flash memory device.

In conventional flash memory, each memory cell resembles a standard metal-oxide-semiconductor field-effect transistor (MOSFET) except that the transistor has two gates instead of one. The memory cells can be seen as an electrical switch in which current flows between two active regions (source and drain) and is controlled by floating gate (FG) and a control gate (CG). The CG is similar to the gate in other MOS transistors, hut below this, there is the FG insulated all around by an oxide layer. The FG is interposed between the CG and the MOSFET channel. Because the FG is electrically isolated by its insulating layer, electrons placed on it are trapped. When the FG is charged with electrons, this charge screens the electrical field from the CG, thus, increasing the threshold voltage ($V_{T1}$) of the cell. Thus, a higher voltage ($V_{T2}$) must be applied to the CG to make the MOSFET channel conductive. In order to read a value from the transistor, an intermediate voltage between the threshold voltages ($V_{T1}$ & $V_{T2}$) is applied to the CG. If the channel conducts at this intermediate voltage, the FG must be uncharged (if it was charged, we would not get conduction because the intermediate voltage is less than $V_{T2}$), and hence, a logical "1" is stored in the gate. If the channel does not conduct at the intermediate voltage, it indicates that the FG is charged, and hence, a logical "0" is stored in the gate. The presence of a logical "0" or "1" is sensed by determining whether there is current flowing through the transistor when the intermediate voltage is asserted on the CG. In a multilevel cell device, which stores more than one bit per cell, the amount of current flow is sensed (rather than simply its presence or absence), in order to determine more precisely the level of charge on the FG.

In various embodiments, the status of the memory device (i.e. logical "1" or "0") can be determined with the contact to the control gate electrode as in other flash memory devices.

Referring to FIG. 1, a continuous tunnel dielectric layer 104L, a continuous floating gate layer 106L, a continuous control gate dielectric layer 114L, a continuous control gate layer 116L and a continuous photoresist layer 118L may be formed on a semiconductor substrate 102. The semiconductor substrate 102 may be made of any suitable material, such as silicon, silicon on insulator (SOI) or silicon on sapphire (SOS). The semiconductor substrate 102 may include electrical dopants (such as p-type dopants or n-type dopants) at an atomic concentration less than $1.0 \times 10^{14}/cm^3$ in order to provide low electrical conductivity and to minimize eddy current that may be induced by inductive coupling with high frequency electrical signals from, to, or between semiconductor dies or redistribution wiring interconnects to be subsequently placed in proximity.

The continuous tunnel dielectric layer 104L may be made of any suitable material, such as an oxide or nitride, such as silicon oxide. The continuous floating gate layer 106L may be made of any suitable material, such as polysilicon. The continuous control gate layer 116L may be made of a metal, such as tungsten, nickel, aluminum or alloys thereof or the continuous control gate layer 116L may be made of be made of polysilicon.

The continuous tunnel dielectric layer 104L, the continuous floating gate layer 106L, the continuous control gate dielectric layer 114L and the continuous control gate layer 116L may be each deposited by any suitable method, such as chemical vapor deposition (CVD), organometallic chemical vapor deposition (OMCVD), plasma enhanced chemical vapor deposition (PECVD), low pressure chemical vapor deposition (LPCVD) or atomic layer deposition (ALD). The continuous photoresist layer 118L may be a positive or negative photoresist.

In various embodiments, the continuous control gate dielectric layer 114L may include a continuous first oxide layer 108L, a continuous nitride layer 110L and continuous second oxide layer 112L. This layered structure may be referred to as a oxide-nitride-oxide (ONO) sandwich layer. A continuous first oxide layer 108L may be deposited over the continuous floating gate layer 106L. The continuous first oxide layer 108L may be made of any suitable oxide, such as $SiO_2$, $HfO_2$, $Al_2O_3$, $Ta_2O_5$, $ZrO_2$, $TiO_2$. Next, a continuous nitride layer 110L, such as silicon nitride, may be deposited over the continuous first oxide layer 108L.

A continuous second oxide layer 112L may be deposited over the continuous nitride layer 110L. In this manner, a continuous oxide/nitride/oxide control gate dielectric layer 114L may be formed over the continuous floating gate layer 106L. The continuous second oxide layer 112L may be made of the same material as the continuous first oxide layer 108L or may be made of a different material. The continuous first oxide layer 108L may have a thickness in the range of 20 Å-200 Å, such as 50 Å-150 Å, although lesser or greater thicknesses are within the contemplated scope of disclosure. The continuous nitride layer 110L may have a thickness in the range of 20 Å-250 Å, such as 50 Å-200 Å, although lesser or greater thicknesses are within the contemplated scope of disclosure. The continuous second oxide layer 112L may have thickness in the range of 100 Å-500 Å, such as 200 Å-400 Å, although lesser or greater thicknesses are within the contemplated scope of disclosure. In an embodiment, a thickness of the continuous second oxide layer 112L may be 5-10% greater than a thickness of the continuous first oxide layer 108L.

Figure 2:
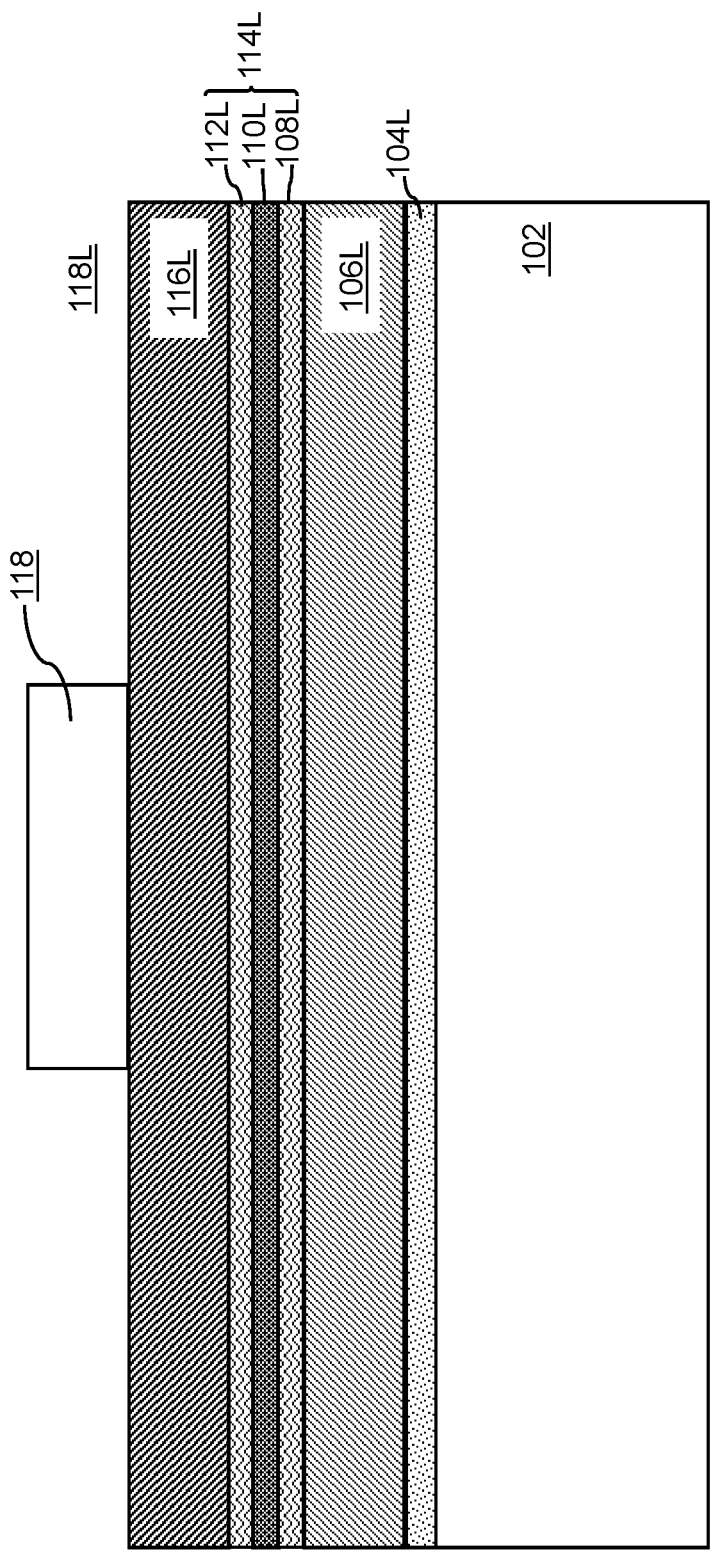
FIG. 2 is a vertical cross-sectional view illustrating a step of patterning the photoresist layer in a method for fabricating a semiconductor device in accordance with some embodiments.

Referring FIG. 2, the continuous photoresist layer 118L may be exposed to radiation and patterned. As illustrated in FIG. 2, the continuous photoresist layer 118L may be patterned to form a patterned photoresist layer 118 such that a central portion of the continuous tunnel dielectric layer 104L, the continuous floating gate layer 106L, the continuous control gate dielectric layer 114L, and the continuous control gate layer 116L are masked by the patterned photoresist layer 118.

Figure 3:
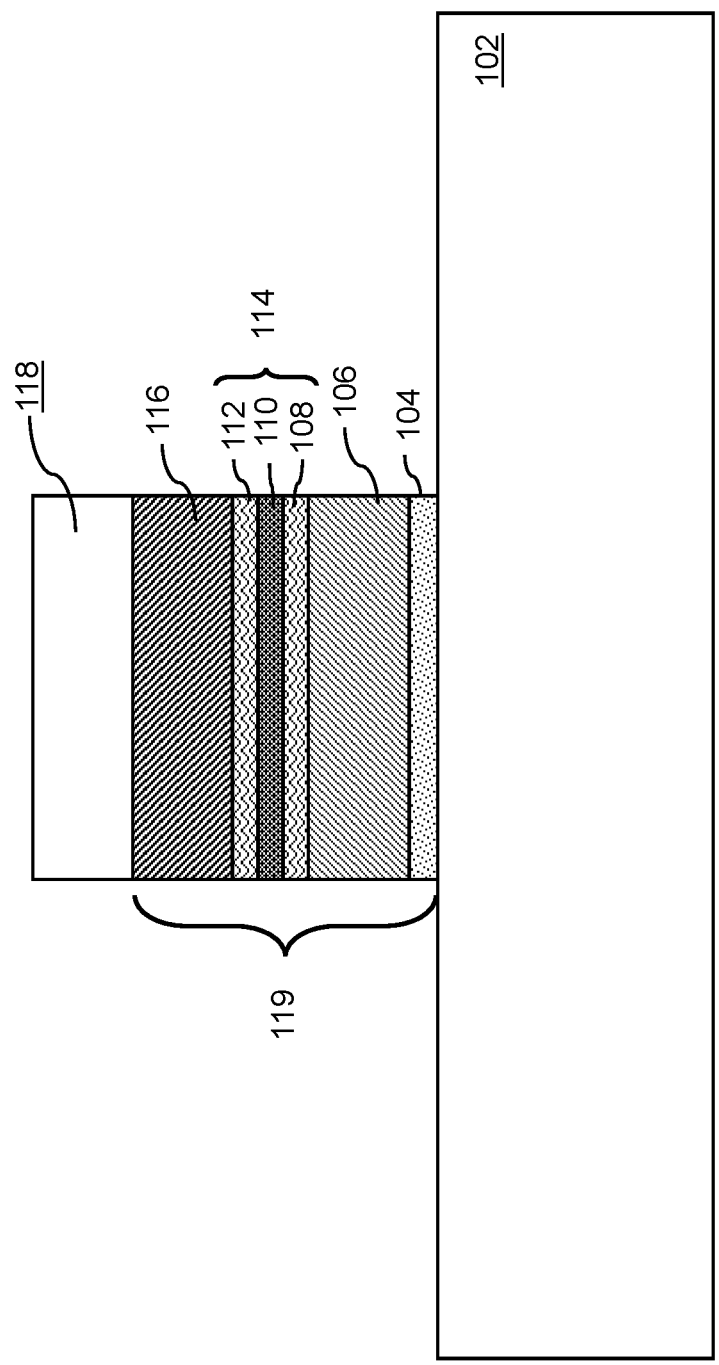
FIG. 3 is a vertical cross-sectional view illustrating a step of patterning the continuous tunnel dielectric layer, the continuous floating gate layer, the continuous control gate dielectric layer and the continuous control gate layer with the patterned photoresist.

Referring FIG. 3, the patterned photoresist layer 118 may then be used to mask and pattern the continuous control gate layer 116L, the continuous control gate dielectric layer 114L (including continuous second oxide layer 112L, continuous nitride layer 110L, and the continuous first oxide layer 108L), the continuous floating gate layer 106L, and the continuous tunnel dielectric layer 104L. The result may be a stack 119 of patterned layers 104, 106, 114, 116 that includes a patterned tunnel dielectric layer 104, a floating gate electrode 106, a patterned control gate dielectric layer 114 and a control gate electrode 116. In various embodiments, the patterned control gate dielectric layer 114 may include an ONO sandwich layer comprising a patterned first oxide layer 108, a patterned nitride layer 110 and a patterned second oxide layer 112. The continuous tunnel dielectric layer 104L, the continuous floating gate layer 106L, the continuous control gate dielectric layer 114L, and the continuous control gate layer 116L may be patterned by one or more wet etching processes, one or more dry etching processes or a combination of wet and dry etching processes.

Figure 4:
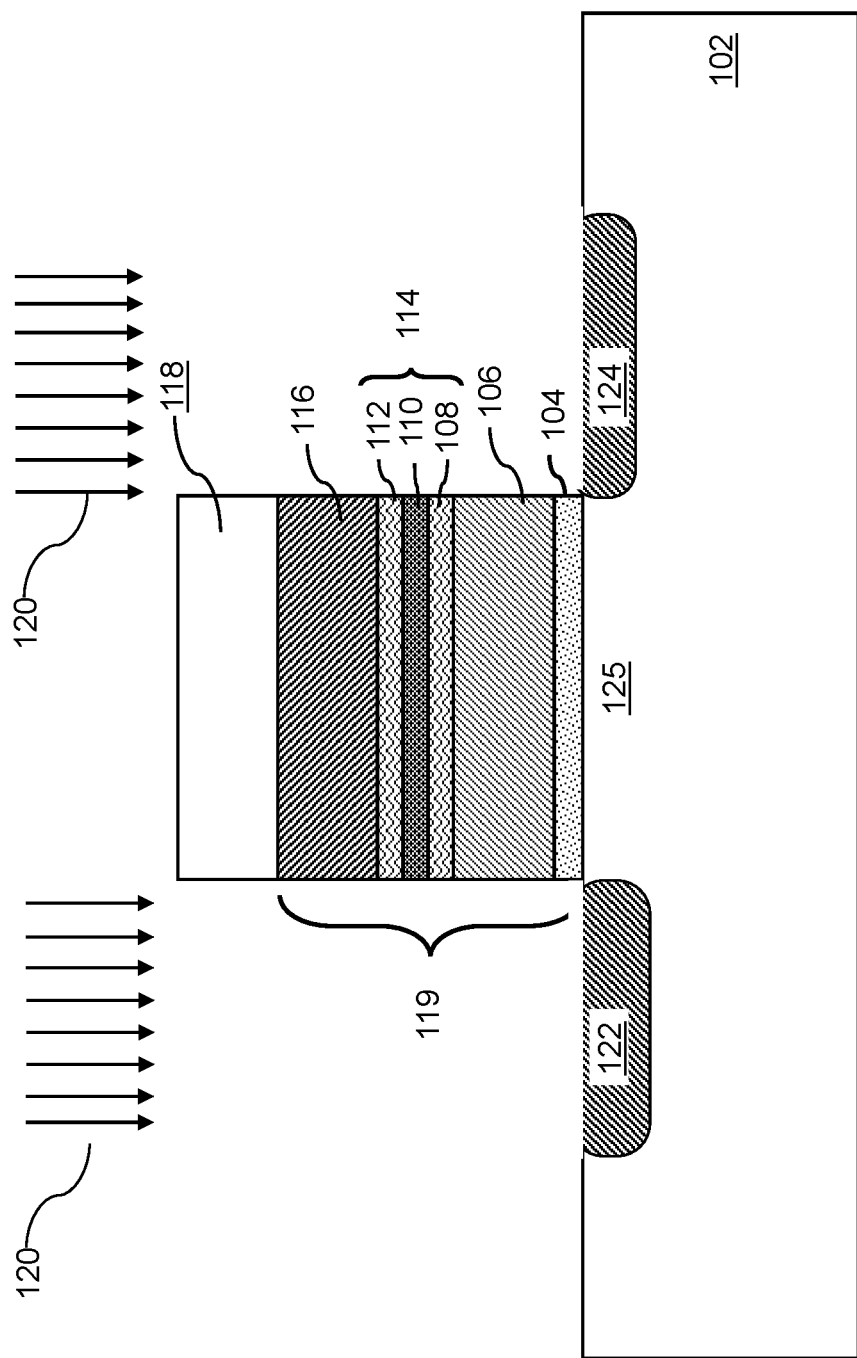
FIG. 4 is a vertical cross-sectional view illustrating a step of ion implanting the substrate to form active extension regions in the substrate in a method for fabricating a semiconductor device in accordance with some embodiments.

Referring to FIG. 4, the semiconductor substrate 102 may be subject to a first ion implantation step 120 to form active extension regions 122, 124 (i.e. source/drain extension regions) in the semiconductor substrate 102. The stack 119 of patterned layers may serve to mask the portion of the semiconductor substrate 102 between the active extension regions 122, 124. Therefore, active extension regions 122, 124 may be self-aligned to the floating gate electrode 106 and the control gate electrode 116. The active extension regions 122, 124 may be doped either p-type or n-type as desired. Example n-type dopants include, but are not limited to, antimony, arsenic and phosphorous. Example p-type dopants include, but are not limited to boron, aluminum and gallium. The active extension regions 122, 124 may have an implanted dopant concentration of $1\times10^{20}$ to $5\times10^{21}$, such as $2\times10^{20}$ to $2\times10^{21}$, although lesser or greater dopant concentrations are within the contemplated scope of disclosure. The region under the stack 119 of patterned layers located between active extension regions 122, 124 constitutes the channel region 125. The patterned photoresist layer 118 may be removed by any suitable process, such as an ashing process. Alternatively, the patterned photoresist layer 118 may be removed prior to the first ion implantation step 120 occurs.

Figure 5:
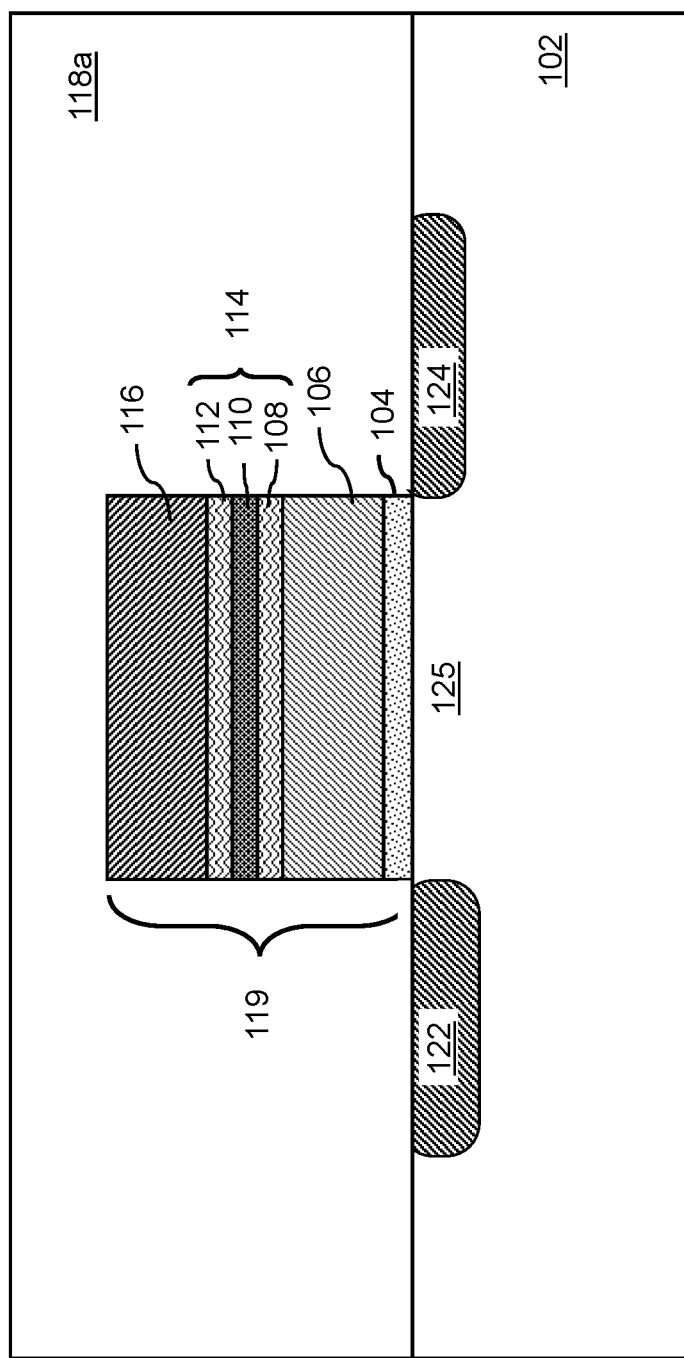
FIG. 5 is a vertical cross-sectional view illustrating a step of depositing a photoresist in a method for fabricating a semiconductor device in accordance with some embodiments.
Figure 6:
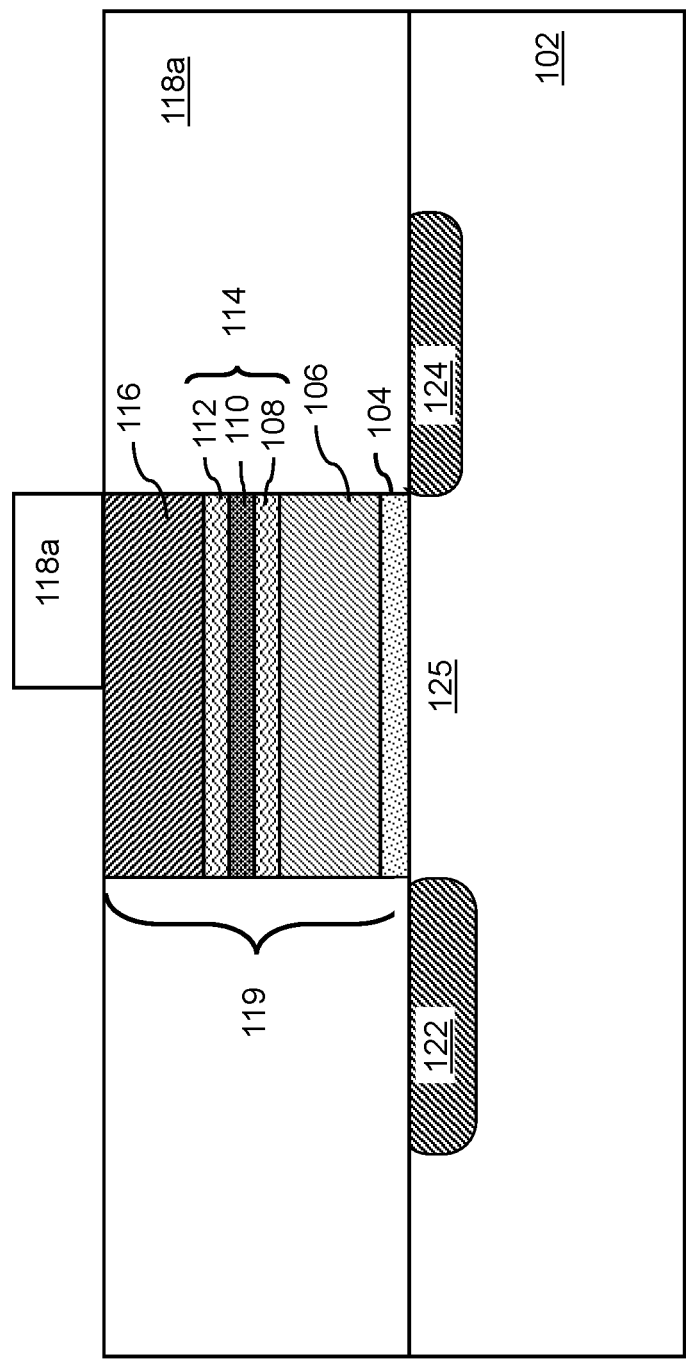
FIG. 6 is a vertical cross-sectional view illustrating a step of patterning a photoresist in a method for fabricating a semiconductor device in accordance with some embodiments.

Referring to FIGS. 5 and 6, a second photoresist layer 118a may be deposited over the semiconductor substrate 102 and the stack 119 of patterned layers 104, 106, 114, 116. The second photoresist layer 118a may then be patterned to expose a portion of the stack 119 of patterned layers 104, 106, 114, 116. The second photoresist layer 118a may be made of the same material as the material of the patterned photoresist layer 118 or may be made of a different material.

Figure 7:
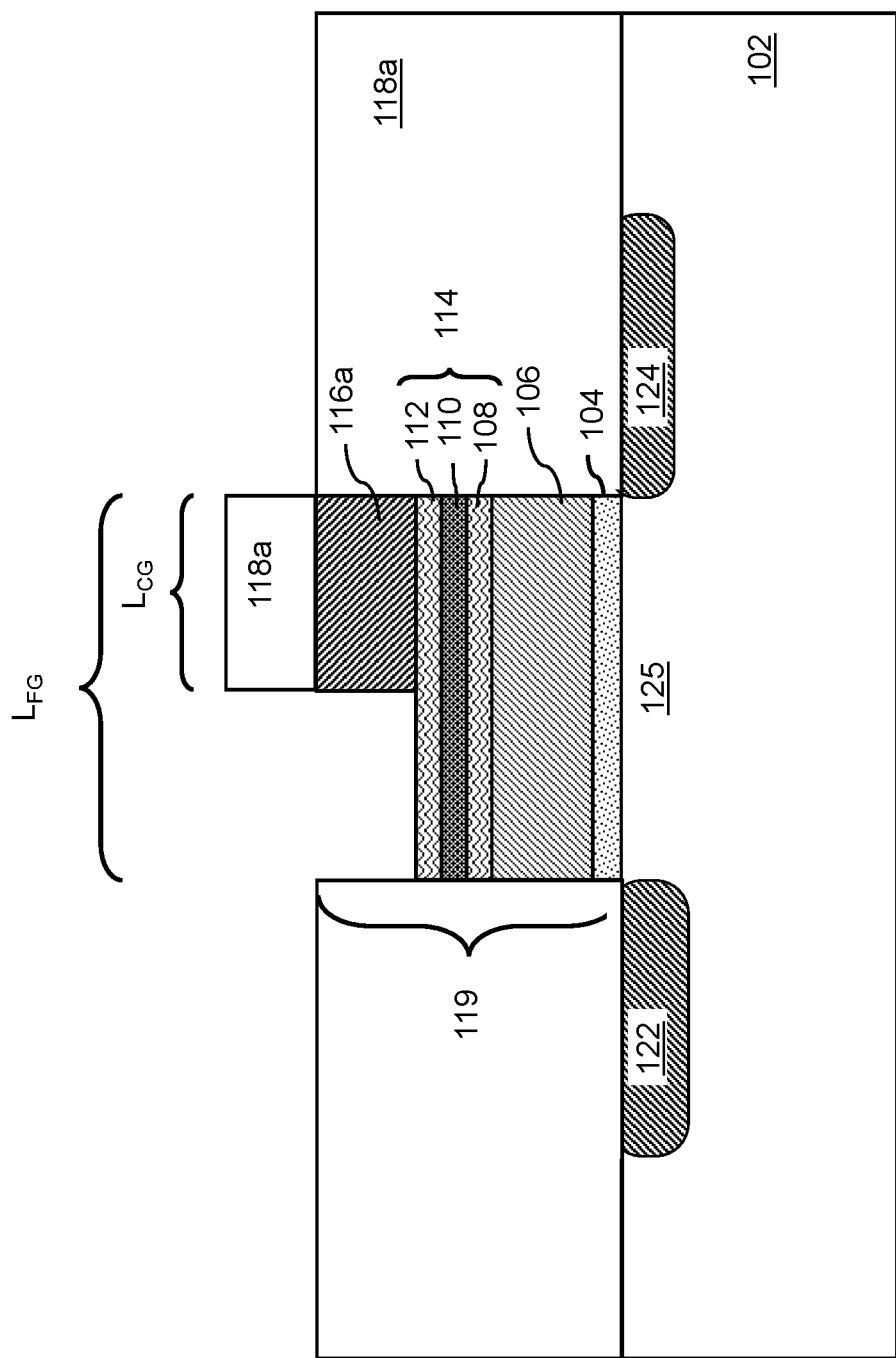
FIG. 7 is a vertical cross-section view illustrating a step of further etching the control gate electrode using the patterned photoresist as a mask.

Referring to FIG. 7, the exposed portion of the control gate electrode 116 may be etched to form a smaller length control gate electrode 116a. That is, the control gate electrode 116 may be etched such that the length $L_{CG}$ of the smaller length control gate electrode 116a along its major axis, is shorter than the length $L_{FG}$ of the underlying floating gate electrode 106 along a major axis of the floating gate electrode 106. The control gate electrode 116 may be either wet etched or dry etched to form the smaller length control gate electrode 116a. The underlying patterned control gate dielectric layer 114 may serve as an etch stop. The remaining second photoresist layer 118a may be removed by any suitable process, such as an ashing process.

Figure 8:
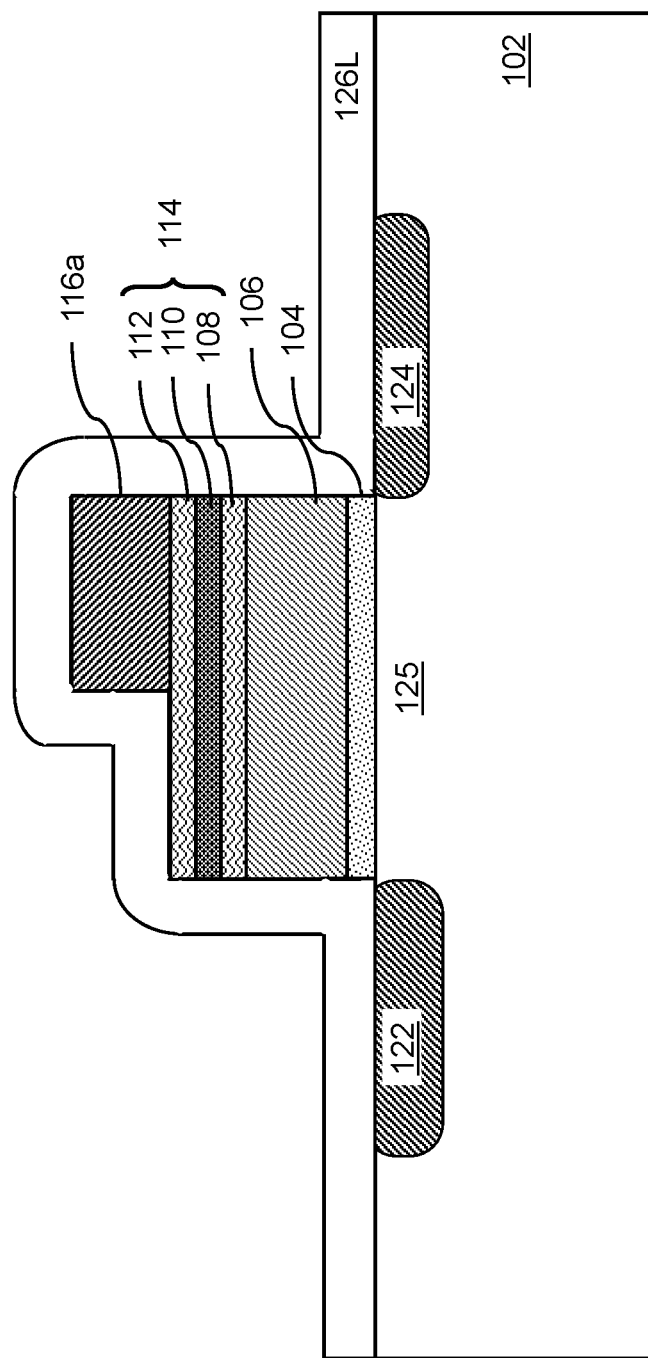
FIG. 8 is a vertical cross-sectional view illustrating a step of forming a continuous sidewall spacer layer in a method for fabricating a semiconductor device in accordance with some embodiments.

Referring to FIG. 8, a continuous sidewall spacer layer 126L may be conformally deposited over the surface of the semiconductor substrate 102 and the stack 119 of patterned layers 104, 106, 114, 116a. The continuous sidewall spacer layer 126L may be made of any suitable dielectric material, such $SiO_2$ or $Si_3N_4$. The continuous sidewall spacer layer 126L may be deposited by any suitable method, such as CVD, OMCVD, PECVD, LPCVD or ALD.

Figure 9:
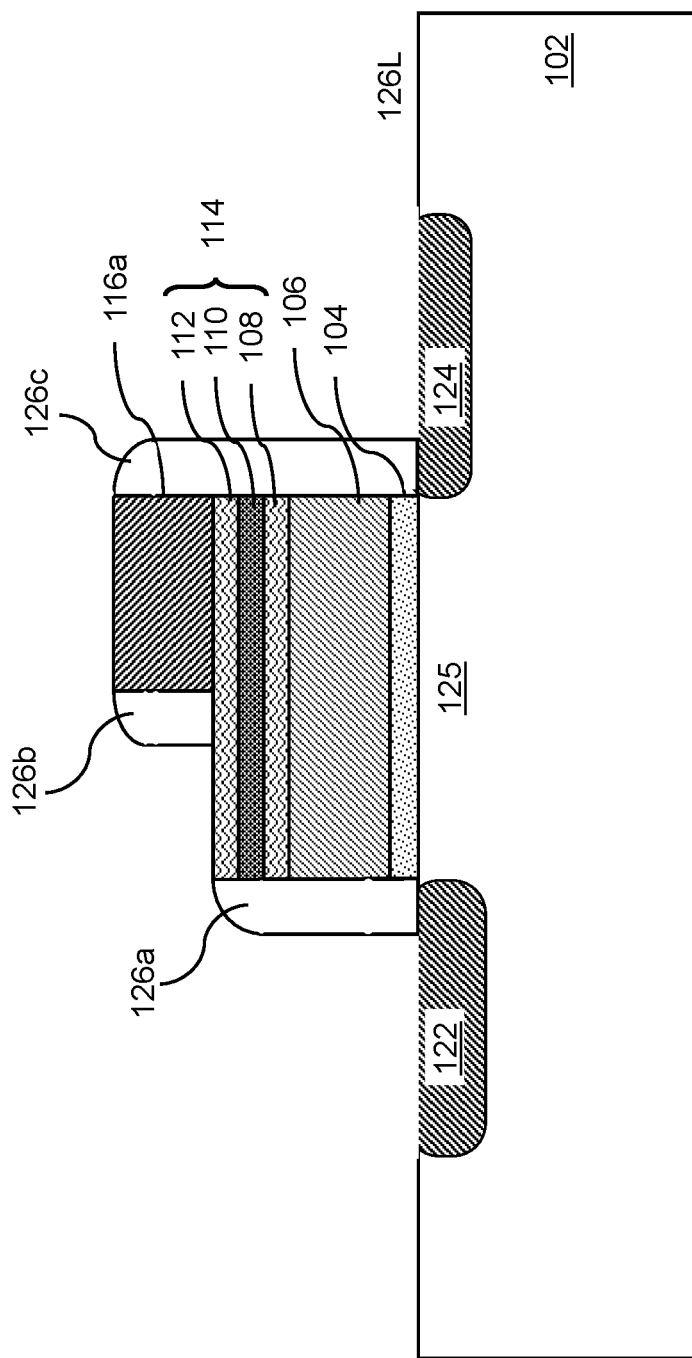
FIG. 9 is a vertical cross-sectional view illustrating a step of forming sidewall spacers by etching the continuous sidewall spacer layer in a method for fabricating a semiconductor device in accordance with some embodiments.

Referring to FIG. 9, the continuous sidewall spacer layer 126L may be anisotropically etched to form a first sidewall spacer 126a located over sidewalls of the patterned tunnel dielectric layer 104, the floating gate electrode 106 and the patterned control gate dielectric layer 114, a second sidewall spacer 126b located over sidewalls of the smaller length control gate electrode 116a and a third sidewall spacer 126c located over sidewalls of the patterned tunnel dielectric layer 104, the floating gate electrode 106, the patterned control gate dielectric layer 114 and the smaller length control gate electrode 116a. The anisotropic etching process removes portions of the continuous sidewall spacer layer 126L such that portions of the substrate 102, portions of the active extension regions 122, 124, a portion of the patterned control gate dielectric layer 114 and the top surface of smaller length control gate electrode 116a may be exposed.

Figure 10:
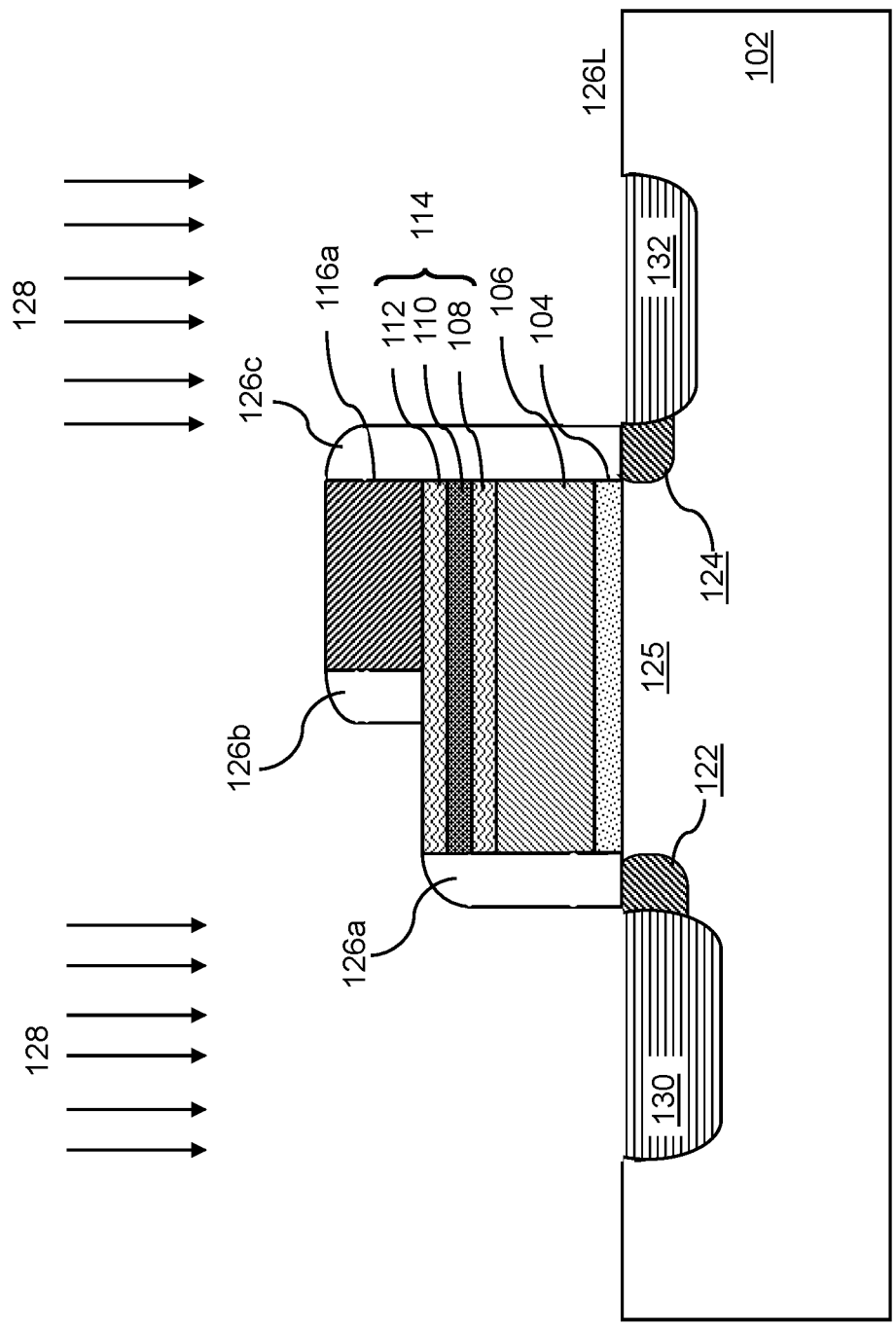
FIG. 10 is a vertical cross-sectional view illustrating a step of ion implanting the substrate to form deep source and drain regions a method for fabricating a semiconductor device in accordance with some embodiments.

Referring to FIG. 10, a second ion implantation step 128 may be performed. In this step, the exposed portions of the active extension regions 122, 124 may be ion implanted to form deep active regions 130, 132 adjacent the active extension regions 122, 124. The deep active regions 130, 132 may have an implanted ion concentration in the range of $1\times10^{20}$ to $5\times10^{21}$, such as $2\times10^{20}$ to $2\times10^{21}$, although lesser or greater dopant concentrations are within the contemplated scope of disclosure. The ions implanted in the second ion implantation step 128 may be the same as or different from the ions implanted in the first ion implantation step 120. Together, one of the active extension regions 122, 124 and the adjacent deep active region 130, 132 form a source region and the other of the active extension regions 122, 124 and the adjacent deep active region 130, 132 for a drain region.

Figure 11:
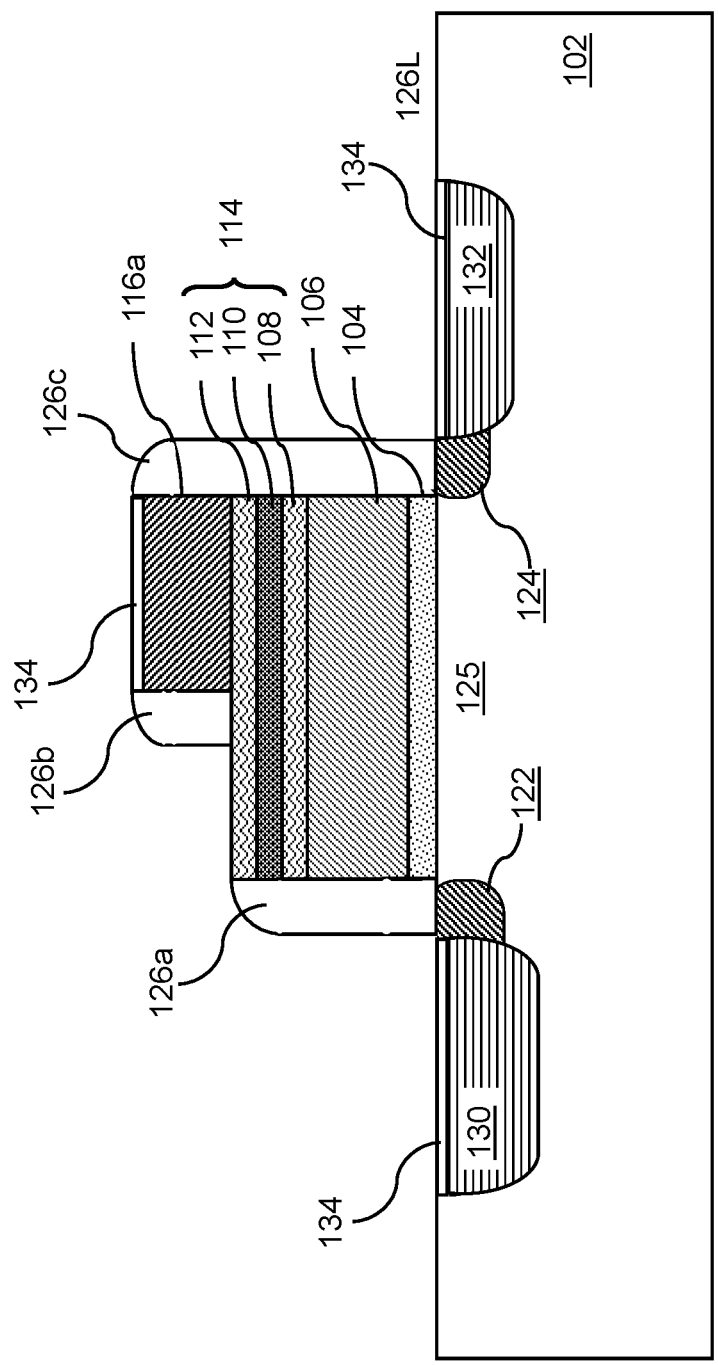
FIG. 11 is a vertical cross-sectional view illustrating a step of siliciding the deep source and drain regions and the gate electrode in a method for fabricating a semiconductor device in accordance with some embodiments.

Referring to FIG. 11, a silicide layer 134 may be optionally formed on the top surfaces of the deep active regions 130, 132. The silicide layer 134 may provide enhanced electrical connection with subsequently formed via contacts. A photoresist layer (not shown) may be deposited over the surface of the intermediate structure illustrated in FIG. 10 and patterned to expose top surfaces of the deep active regions 130, 132. The silicide layer 134 may then be formed by depositing a thin layer of metal (not shown) and heating to react the metal with the deep active regions 130, 132. Further, as illustrated, if the smaller length control gate electrode 116a is made of polysilicon, metal may be deposited on the top surface of the smaller length control gate electrode 116a and heated for form a silicide layer 134 on the top surface of the control gate electrode 116a.

Figure 12:
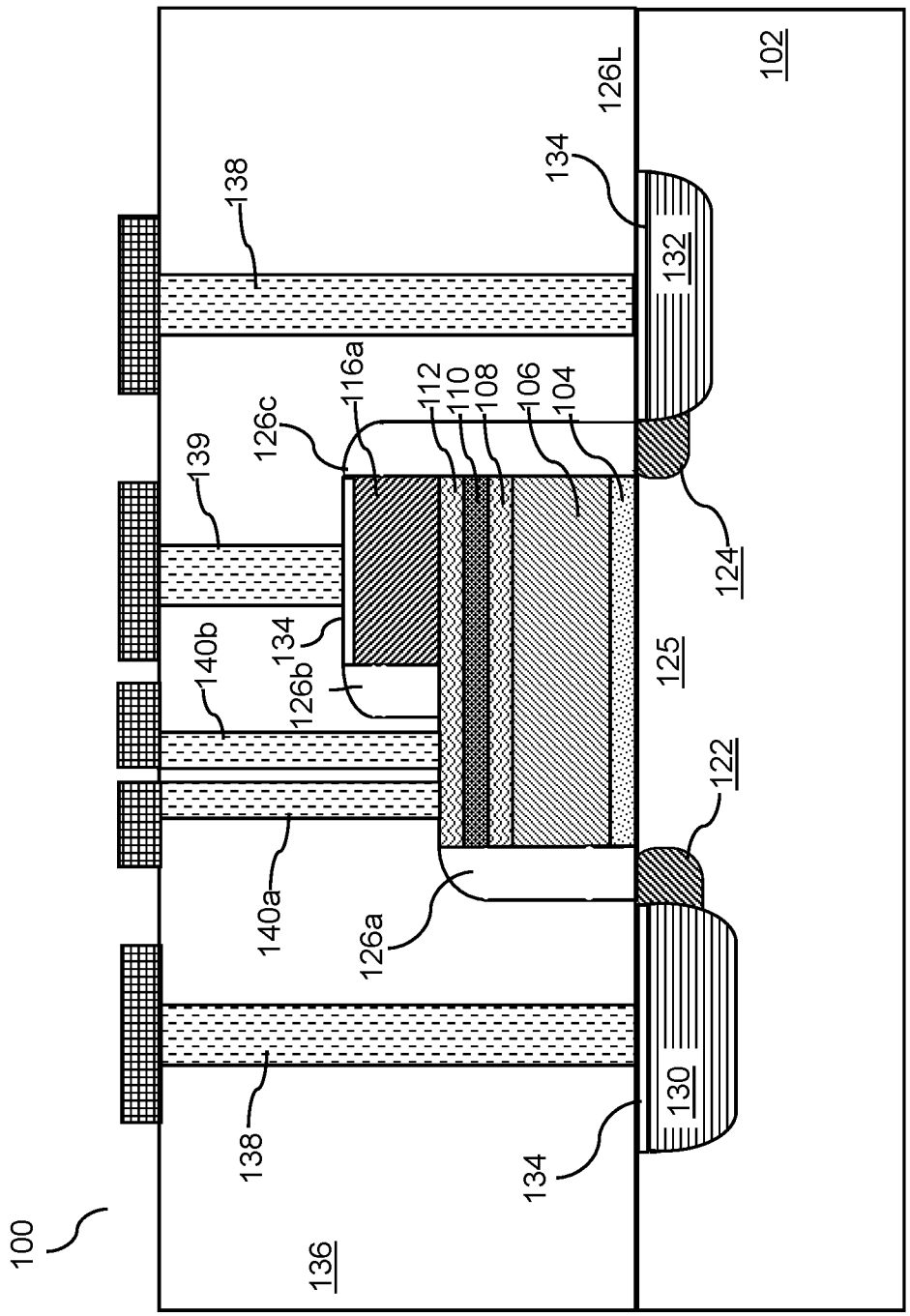
FIG. 12 is a vertical cross-sectional view illustrating a step of forming an interlevel dielectric layer and source/drain electrodes in a method for fabricating a semiconductor device in accordance with some embodiments.

Referring to FIG. 12, an interlevel dielectric layer 136 may be deposited over the entirety of the intermediate structure illustrated in FIG. 11. Via holes (not shown) may be formed in the interlevel dielectric layer 136 and subsequently filled with metal, such as W, Cu, Co, Mo, Ru, other elemental metals, or an alloy or a combination thereof. In this manner, electrical contacts 138 to the deep active regions 130, 132 may be formed to complete a flash memory cell 100. The formation of the interlevel dielectric layer 136 and the electrical contacts 138 completes a flash memory cell 100. In an embodiment, the flash memory cell 100 may have a first electrical contact 138 electrically connected to one of the deep active regions 130, 132 (source or drain) through optional silicide layer 134, a second electrical contact 138 electrically connected to the other deep active region 130, 132 (source or drain) through optional silicide layer 134, and a third electrical contact 139 electrically connected to the smaller length control gate electrode 116a through optional silicide layer 134. A fourth electrical contact 140a may be electrically connected to the patterned control gate dielectric layer 114 through optional top layer of the patterned second oxide layer 112. In an embodiment, the flash memory cell 100 may include a fifth electrical contact 140b electrically connected to the patterned control gate dielectric layer 114 through optional top layer of the patterned second oxide layer 112. In various embodiments, the flash memory cell 100 may be configured such that the flash memory cell 100 may be programmed and erased by applying a voltage to the fourth electrical contact 140a and read by applying a voltage to the fifth electrical contact 140b.

Figure 13:
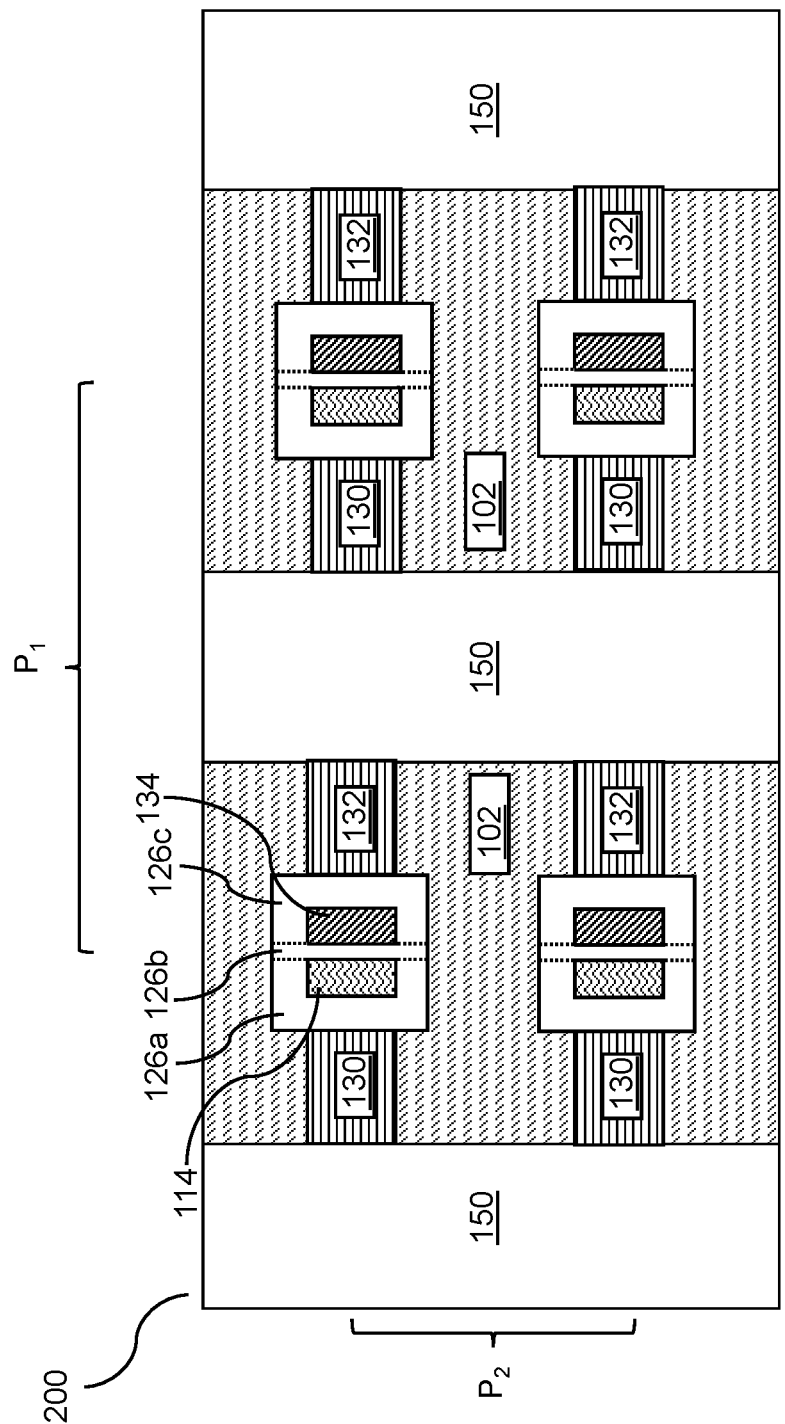
FIG. 13 is a top-down view of an array of flash memory cells in accordance with some embodiments.

FIG. 13 illustrates a two dimensional array 200 of flash memory cells 100. To electrically isolate columns of adjacent flash memory cells 100, shallow trench isolation (STI) structures 150 may be formed in the semiconductor substrate 102. The shallow trench isolation structures 150 may be formed by etching trenches (not shown) in the semiconductor substrate 102 and filling the trenches with a dielectric material, such as $SiO_2$. The STI trenches may have a depth in a range from 50 nm to 500 nm, such as 100 nm to 400 nm, although lesser or greater depths are within the contemplated scope of disclosure. For example, the STI trenches 150 may have a depth in a range of 75 nm to 400 nm, 100 nm to 350 nm, although lesser or greater depths are within the contemplated scope of disclosure.

In various embodiments, the two dimensional array 200 of flash memory cells 100 includes a two-dimensional periodic array of floating gate electrodes 106 and smaller length control gate electrode 116a located over a semiconductor substrate 102 which has a doping of a first conductivity type. The smaller length control gate electrode 116a may be located over the floating gate electrodes 106. The length $L_{CG}$ along a major axis of the smaller length control gate electrode 116a may be less than a length $L_{FG}$ along a major axis of the floating gate electrode 106. The two dimensional array 200 of flash memory cells 100 also includes a two-dimensional array of deep active regions 130, 132 that may be formed within the semiconductor substrate 102. The deep active regions 130, 132 have a doping of a second conductivity type. The two-dimensional array of deep active regions 130, 132 may be laterally offset from the two-dimensional array of floating gate electrodes 106 along a first horizontal direction. Each of the floating gate electrodes 106 may be located between a neighboring pair of deep active regions 130, 132 within the two-dimensional array of deep active regions 130, 132. In various embodiments, each of the two-dimensional array of floating gate electrodes 106, the two-dimensional array of deep active regions 130, 132, and the two-dimensional array of smaller length control gate electrode 116a has a same first pitch along the horizontal direction.

Figure 14:
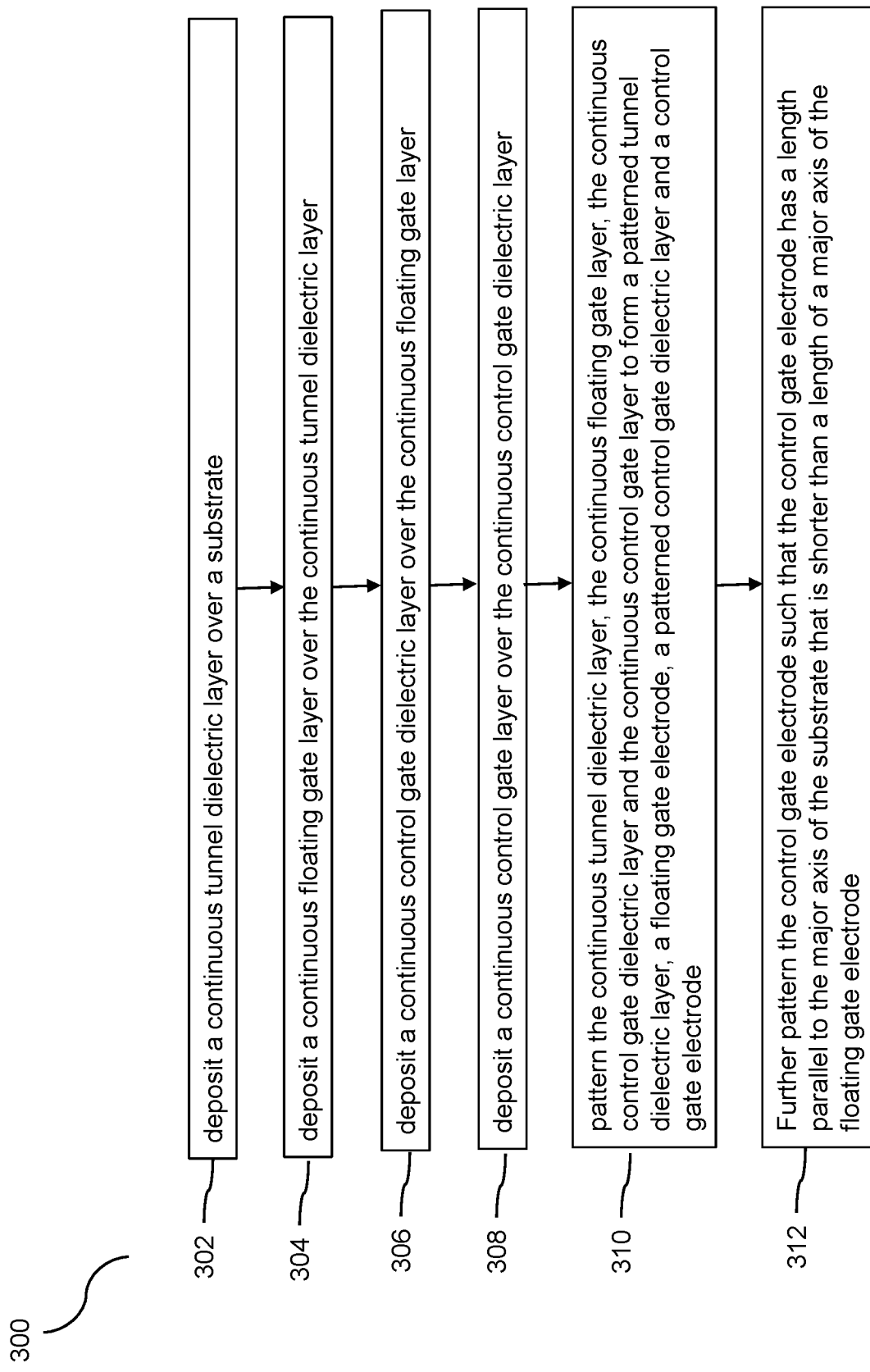
FIG. 14 is a flowchart illustrating a method of making a semiconductor memory device in accordance with some embodiments.

FIG. 14 is a flowchart illustrating general method 300 of making a memory device according to various embodiments. Referring to step 302, a continuous tunnel dielectric layer 104L may be deposited over a semiconductor substrate 102. The tunnel dielectric may be made of any suitable dielectric material and may have a thickness in the range of 1-15 nm. Referring to step 304 a continuous floating gate layer 106L may be deposited over the continuous tunnel dielectric layer 104L. Referring to step 306, a continuous control gate dielectric layer 114L may be deposited over the continuous floating gate layer 106L. In various embodiments, the continuous control gate dielectric layer 114L may comprise a continuous first oxide layer 108L, a continuous nitride layer 110L and a continuous second oxide layer 112L. Referring to step 308, a continuous control gate layer 116L may be deposited over the continuous control gate dielectric layer 114L. The continuous tunnel dielectric layer 104L, continuous floating gate layer 106L, continuous control gate dielectric layer 114L and continuous control gate layer 116L may be deposited by any suitable method such as CVD, OMCVD, PECVD, LPCVD or ALD. Referring to step 310, the continuous tunnel dielectric layer 104L, the continuous floating gate layer 106L, the continuous control gate dielectric layer 114L and the continuous control gate layer 116L may be patterned to form a patterned tunnel dielectric layer 104, a floating gate electrode 106, a patterned control gate dielectric layer 114 and a control gate electrode 116. Patterning may be performed by depositing a continuous photoresist layer 118L over the continuous control gate layer 116L and using photolithography to pattern an appropriate mask over the continuous tunnel dielectric layer 104L, the continuous floating gate layer 106L, the continuous control gate dielectric layer 114L and the continuous control gate layer 116L. The exposed layers of the continuous tunnel dielectric layer 104L, the continuous floating gate layer 106L, the continuous control gate dielectric layer 114L and the continuous control gate layer 116L may be etched to form the control gate electrode 116, patterned control gate dielectric layer 114, floating gate electrode 106 and patterned tunnel dielectric layer 104. Any suitable etching method such as wet etching, dry etching or their combination may be used to form the control gate electrode 116, the patterned control gate dielectric layer 114, the floating gate electrode 106 and the patterned tunnel dielectric layer 104. Referring to step 312, the control gate electrode 116 may be further patterned to form a smaller length control gate electrode 116a. The smaller length control gate electrode 116a may have a length $L_{CG}$ parallel to the major axis of the semiconductor substrate 102 that is shorter than a length $L_{FG}$ of the floating gate electrode 106.

Generally, the structures and methods of the present disclosure may be used to form flash memory cells 100 in which at least some of the flash memory cells 100 have a smaller length control gate electrode 116a which is shorter in length $L_{CG}$ than the floating gate electrode 106. Further, at least some of the flash memory cells 100 may have at least one electrical contact 140a, 140b to the patterned control gate dielectric layer 114 in addition to the electrical contacts 138 to the deep active regions 130, 132 (source/drain regions) and the third electrical contact 139 to the smaller length control gate electrode 116a. The floating gate electrode 106 may be programmed and erased by applying a voltage to the electrical contact 140a, 140b connected to the patterned control gate dielectric layer 114. By using the electrical contact 140a, 140b to the patterned control gate dielectric layer 114 for programming and erasing rather than using the smaller length control gate electrode 116a, the resistance $R_{poly}$ associated with the (polysilicon) smaller length control gate electrode 116a may be avoided. The elimination of the resistance $R_{poly}$ associated with the polysilicon smaller length control gate electrode 116a may result in a faster memory device. In some embodiments, more than one electrical contact 140a, 140b may be provided to the control gate dielectric layer 114. This may result in an increased coupling area which may lead to a higher coupling ratio. The increase in the coupling ratio may also result in a faster flash memory cell 100.

An embodiment is drawn to a flash memory cell 100 located on a semiconductor substrate 102 including a floating gate electrode 106, a patterned tunnel dielectric layer 104 located between the semiconductor substrate 102 and the floating gate electrode 106, a smaller length control gate electrode 116a and a patterned control gate dielectric layer 114 located between the floating gate electrode 106 and the smaller length control gate electrode 116a. The length $L_{CG}$ of a major axis of the smaller length control gate electrode 116a is less than a length $L_{FG}$ of a major axis of the floating gate electrode 106.

An embodiment is drawn to a two dimensional array 200 of flash memory cells 100 including a two-dimensional array of floating gate electrodes 106 and smaller length control gate electrode 116a located over a semiconductor substrate 102 having a doping of a first conductivity type. The smaller length control gate electrode 116a may be located over the floating gate electrodes 106 and have a length $L_{CG}$ along a major axis of the smaller length control gate electrode 116a that is less than a length $L_{FG}$ along a major axis of the floating gate electrode 106. The two dimensional array 200 also includes a two-dimensional array of deep active regions 130, 132 that may be formed within the semiconductor substrate 102. The deep active regions 130, 132 may have a doping of a second conductivity type. Also, the deep active regions 130, 132 may be laterally offset from the two-dimensional array of floating gate electrodes 106 along a first horizontal direction. Each of the floating gate electrodes 106 may be located between a neighboring pair of deep active regions 130, 132 within the two-dimensional array of deep active regions 130, 132.

In various embodiments, each of the two-dimensional array of floating gate electrodes 106, the two-dimensional array of deep active regions 130, 132, and the two-dimensional array of smaller length control gate electrode 116a may have a same first pitch $P_1$ along the first horizontal direction. In various embodiments, the array of flash memory cells 100 comprises a two-dimensional periodic array of flash memory cells 100. Each flash memory cell 100 in the two-dimensional periodic array comprises a floating gate electrode 106 in the two-dimensional array of floating gate electrodes 106, deep active regions 130, 132 in a two-dimensional array of deep active regions 130, 132, and a smaller length control gate electrode 116a in the two-dimensional array of smaller length control gate electrode 116a. Each flash memory cell 100 in the two-dimensional periodic array 200 may be laterally offset from an adjacent flash memory cell 100 in the two-dimensional periodic array 200 along a second horizontal direction with a same second pitch $P_2$.

An embodiment is drawn to a method 300 of making a flash memory device 100 including depositing a continuous tunnel dielectric layer 104L over a semiconductor substrate 102, depositing a continuous floating gate layer 106L over the continuous tunnel dielectric layer 104L, depositing a continuous control gate dielectric layer 114L over the continuous floating gate layer 106L, depositing a continuous control gate layer 116L over the continuous control gate dielectric layer 114L, patterning the continuous tunnel dielectric layer 104L, the continuous floating gate layer 106L, the continuous control gate dielectric layer 114L and the continuous control gate layer 116L to form a patterned tunnel dielectric layer 104, a floating gate electrode 106, a patterned control gate dielectric layer 114 and a control gate electrode 116 and further patterning the control gate electrode 116 to form a smaller length control gate electrode 116a such that the smaller length control gate electrode 116a has a length $L_{CG}$ parallel to the major axis of the substrate 102 that is shorter than a length $L_{FG}$ of a major axis of the floating gate electrode 106.

In an embodiment, active extension regions 122, 124 may be formed in the semiconductor substrate 102 extending laterally from sidewalls of the patterned tunnel dielectric layer 104. The active extension regions 122, 124 may be formed by a first ion implantation step 120. In an embodiment, deep active regions 130, 132 may be formed with a second ion implantation step 128.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a flash memory device, comprising:
    depositing a continuous tunnel dielectric layer over a substrate;
    depositing a continuous floating gate layer over the continuous tunnel dielectric layer;
    depositing a continuous control gate dielectric layer over the continuous floating gate layer;
    depositing a continuous control gate layer over the continuous control gate dielectric layer;
    patterning the continuous tunnel dielectric layer, the continuous floating gate layer, the continuous control gate dielectric layer and the continuous control gate layer by performing a first anisotropic etch process to form a patterned tunnel dielectric layer, a floating gate electrode, a patterned control gate dielectric layer and a control gate electrode;
    further patterning the control gate electrode by performing a second anisotropic etch process to expose a surface of the patterned control gate dielectric layer and form a smaller length control gate electrode such that the smaller length control gate electrode has a length along a major axis of the smaller length control gate electrode that is less than a length of the floating gate electrode along a major axis of the floating gate electrode;
    forming a source region and a drain region in the substrate; and
    forming an electrical contact on the exposed surface of the patterned control gate dielectric layer, wherein the exposed surface of the control gate dielectric layer is over a channel region located between the source region and the drain region.

2. The method of claim 1, wherein the forming of the source region and the drain region comprises forming active extension regions in the substrate by performing a first ion implantation step after the first anisotropic etch process and prior to performing the second anisotropic etch process, wherein the active extension regions extend laterally from sidewalls of the patterned tunnel dielectric layer.

3. The method of claim 2, wherein the forming of the source region and the drain region further comprises forming deep active regions by performing a second ion implantation step after performing the second anisotropic etch process.

4. The method of claim 1, further comprising:
forming an electrical contact directly on the smaller length control gate electrode, wherein the forming the electrical contact on the exposed surface of the patterned control gate dielectric layer comprises forming an additional electrical contact directly on the patterned control gate dielectric layer.

5. The method of claim 4, further comprising forming a yet additional electrical contact directly on the patterned control gate dielectric layer.

6. The method of claim 5, further comprising:
forming first interconnect structures on the additional electrical contact, wherein the first interconnect structures connect the additional electrical contact to a programming circuit; and
forming second interconnect structures on the yet additional electrical contact, wherein the second interconnect structures connect the yet additional electrical contact to a read circuit.

7. The method of claim 1, further comprising:
forming a source electrical contact on the source region; and
forming a drain electrical contact on the drain region.

8. The method of claim 1, further comprising depositing and patterning a continuous sidewall spacer layer, whereby a continuous structure including a first sidewall spacer and a second sidewall spacer is formed, wherein:
the first sidewall spacer is formed over first sidewalls of the patterned tunnel dielectric layer, the floating gate electrode and the patterned control gate dielectric layer that are located within a first vertical plane; and
the second sidewall spacer is formed over a first sidewall of the smaller length control gate electrode.

9. The method of claim 8, wherein the continuous structure comprises a third sidewall spacer which is formed over second sidewalls of the patterned tunnel dielectric layer, the floating gate electrode, the patterned control gate dielectric layer and the smaller length control gate electrode that are located within a second vertical plane.

10. The method of claim 1, wherein depositing the continuous control gate dielectric layer comprises depositing a continuous first oxide layer, a continuous nitride layer and a continuous second oxide layer.

11. A method for forming a flash memory cell, comprising:
forming a layer stack including a continuous tunnel dielectric layer, a continuous floating gate layer, a continuous control gate dielectric layer, a continuous control gate layer over a semiconductor substrate;
patterning the layer stack, wherein a patterned portion of the layer stack comprises a stack of patterned layers including a tunnel dielectric layer, a floating gate electrode, a control gate dielectric layer, and a control gate electrode;
reducing a size of the control gate electrode by etching a portion of the control gate electrode to expose a surface of the control gate dielectric layer, wherein a lateral extent of the control gate electrode along a horizontal direction becomes less than a lateral extent of the control gate dielectric layer along the horizontal direction;
forming a source region and a drain region in an upper portion of the semiconductor substrate, wherein the source region and the drain region are laterally spaced apart along the horizontal direction; and
forming an electrical contact on the exposed surface of the control gate dielectric layer, wherein the exposed surface of the control gate dielectric layer is over a channel region located between the source region and the drain region.

12. The method of claim 11, wherein the forming of the electrical contact comprises forming the electrical contact directly on a segment of a top surface of the control gate dielectric layer.

13. The method of claim 12, further comprising forming interconnect structures on the electrical contact, wherein the interconnect structures are electrically connected to a programming circuit.

14. The method of claim 12, further comprising forming an additional electrical contact directly on another segment of the top surface of the control gate dielectric layer.

15. The method of claim 14, further comprising forming interconnect structures on the additional electrical contact, wherein the interconnect structures are electrically connected to a read circuit.

16. A method for forming a flash memory cell, comprising:
forming a stack including a tunnel dielectric layer, a floating gate electrode, a control gate dielectric layer, and a control gate electrode over a semiconductor substrate, wherein each sidewall of the stack vertically extends from a top surface of the semiconductor substrate to an edge of a top surface of the control gate electrode within a respective vertical plane;
reducing a size of the control gate electrode by etching a portion of the control gate electrode to expose a surface of the control gate dielectric layer, wherein a lateral extent of the control gate electrode along a horizontal direction becomes less than a lateral extent of the control gate dielectric layer along the horizontal direction; and
forming a source region and a drain region in an upper portion of the semiconductor substrate, wherein the source region and the drain region are laterally spaced apart along the horizontal direction; and
forming an electrical contact on the exposed surface of the control gate dielectric layer, wherein the exposed surface of the control gate dielectric layer is over a channel region located between the source region and the drain region.

17. The method of claim 16, further comprising forming a continuous structure including a first sidewall spacer, a second sidewall spacer, and a third sidewall spacer, wherein:
the first sidewall spacer is formed over first sidewalls of the tunnel dielectric layer, the floating gate electrode, and the control gate dielectric layer;
the second sidewall spacer is formed over a first sidewall of the control gate electrode; and the third sidewall spacer is formed over second sidewalls of the tunnel dielectric layer, the floating gate electrode, the control gate dielectric layer, and the control gate electrode.

18. The method of claim 17, wherein:
the first sidewalls of the of the tunnel dielectric layer, the floating gate electrode, and the control gate dielectric layer are located entirely within a first vertical plane;
the second sidewalls of the tunnel dielectric layer, the floating gate electrode, the control gate dielectric layer, and the control gate electrode are located entirely within a second vertical plane; and
the first sidewall of the control gate electrode is located entirely within a third vertical plane that is located between the first vertical plane and the second vertical plane.

19. The method of claim 17, wherein the forming of the source region and the drain region comprises:

forming a source extension region and a drain extension region by performing a first ion implantation step after formation of the stack and prior to reducing the size of the control gate electrode; and forming deep active regions by performing a second ion implantation step after formation of the continuous structure, wherein a combination of the source extension region and one of the deep active regions constitutes the source region and a combination of the drain extension region and another of the deep active regions constitutes the drain region.

20. The method of claim 16, wherein the forming of the electrical contact comprises forming the electrical contact directly on a segment of a top surface of the control gate dielectric layer.

* * * * *